US012793800B2

(12) United States Patent
Chen

(10) Patent No.: US 12,793,800 B2
(45) Date of Patent: Nov. 10, 2026

(54) FLASH MEMORY APPARATUS

(71) Applicant: Winbond Electronics Corp., Taichung City (TW)

(72) Inventor: Chung-Zen Chen, HsinChu (TW)

(73) Assignee: Winbond Electronics Corp., Taichung City (TW)

( * ) Notice: Subject to any disclaimer, the term of this patent is extended or adjusted under 35 U.S.C. 154(b) by 98 days.

(21) Appl. No.: 19/083,466

(22) Filed: Mar. 19, 2025

(65) Prior Publication Data

US 2026/0051355 A1 Feb. 19, 2026

(30) Foreign Application Priority Data

Aug. 13, 2024 (TW) ................................ 113130374

(51) Int. Cl.
*G11C 16/34* (2006.01)
*G11C 16/08* (2006.01)

(52) U.S. Cl.
CPC .......... *G11C 16/3459* (2013.01); *G11C 16/08* (2013.01); *G11C 16/3418* (2013.01)

(58) Field of Classification Search
CPC . G11C 16/3459; G11C 16/08; G11C 16/3418; G11C 16/10; G11C 16/24; G11C 16/32; G11C 16/26; G11C 16/3445; G11C 16/14
See application file for complete search history.

(56) References Cited

U.S. PATENT DOCUMENTS 6,975,543 B2 12/2005 Kurihara
2022/0366964 A1* 11/2022 Kang ....................... G11C 7/22
2023/0290415 A1* 9/2023 Xu ......................... G11C 16/24

* cited by examiner

*Primary Examiner* — Amir Zarabian
*Assistant Examiner* — Justin Bryce Heisterkamp
(74) *Attorney, Agent, or Firm* — JCIPRNET

(57) ABSTRACT

A flash memory apparatus includes a memory array, bit lines, a decoder, a sensing circuit, and a synchronous refresh switch circuit. The memory array includes a plurality of memory regions. Each of the memory regions includes a plurality of memory cells. The decoder selects target memory cells from the memory cells according to an address signal. The sensing circuit includes a plurality of sense amplifier groups. The synchronous refresh switch circuit includes a plurality of first synchronous refresh switches. The first synchronous refresh switches are respectively coupled between a first input terminal of a first sense amplifier and a first input terminal of a second sense amplifier of each of the sense amplifier groups. During a refresh operation, the first synchronous refresh switches are turned on to simultaneously perform a refresh verification and a program verification on the corresponding target memory cells.

16 Claims, 5 Drawing Sheets

FLASH MEMORY APPARATUS

CROSS-REFERENCE TO RELATED APPLICATION

This application claims the priority benefit of Taiwan application serial no. 113130374, filed on Aug. 13, 2024. The entirety of the above-mentioned patent application is hereby incorporated by reference herein and made a part of this specification.

BACKGROUND OF THE INVENTION

Field of the Invention

The invention relates to a memory apparatus, and in particular to a flash memory apparatus capable of reducing the verification time of a refresh operation.

Description of Related Art

A flash memory apparatus may perform a program operation, an erase operation, and a read operation, wherein the erase operation takes the longest time. During the erase operation, the preprogram operation, an erase operation, and a soft program operation are sequentially performed on the selected region in the memory array. Next, the refresh operation is performed on unselected regions in the memory array that share the same well regions as the selected regions to restore the threshold voltage of the disturbed memory cells.

During the refresh operation, refresh verification and program verification need to be performed on the same target memory cell. The refresh verification is used to confirm whether the threshold voltage of the target memory cell is higher than the refresh verification reference voltage (for example, 6.5 volts), and the program verification is used to confirm whether the threshold voltage is less than the program verification reference voltage (for example, 7 volts). If the threshold voltage of the target memory cell is between the program verification reference voltage and the refresh verification reference voltage, the refresh voltage is then applied to the target memory cell to restore the threshold voltage thereof to above the program verification reference voltage. However, in conventional designs, refresh verification and program verification are performed sequentially, taking a lot of verification time.

SUMMARY OF THE INVENTION

The invention provides a flash memory apparatus that may simultaneously perform refresh verification and program verification during a refresh operation to reduce verification time.

A flash memory apparatus of the invention includes a memory array, a plurality of bit lines, a decoder, a sensing circuit, and a synchronous refresh switch circuit. The memory array includes a plurality of memory regions. Each of the memory regions includes a plurality of memory cells respectively coupled to the plurality of bit lines. The decoder is coupled to the bit lines and configured to receive an address signal and select a plurality of target memory cells from the plurality of memory cells according to the address signal. The sensing circuit includes a plurality of sense amplifier groups. Each of the sense amplifier groups includes a first sense amplifier and a second sense amplifier. A first input terminal of the first sense amplifier and a first input terminal of the second sense amplifier are coupled to the decoder. The synchronous refresh switch circuit includes a plurality of first synchronous refresh switches. The plurality of first synchronous refresh switches are respectively coupled between the first input terminal of the first sense amplifier and the first input terminal of the second sense amplifier of each of the sense amplifier groups. During a refresh operation, the first synchronous refresh switches are turned on to simultaneously perform a refresh verification and a program verification on the corresponding target memory cells.

Based on the above, the flash memory apparatus of the invention may simultaneously verify different comparison levels of the selected target memory cells using two sense amplifiers during the refresh operation. In this way, the verification time may be reduced, thereby improving the execution efficiency of the erase operation.

DESCRIPTION OF THE EMBODIMENTS

Figure 1:
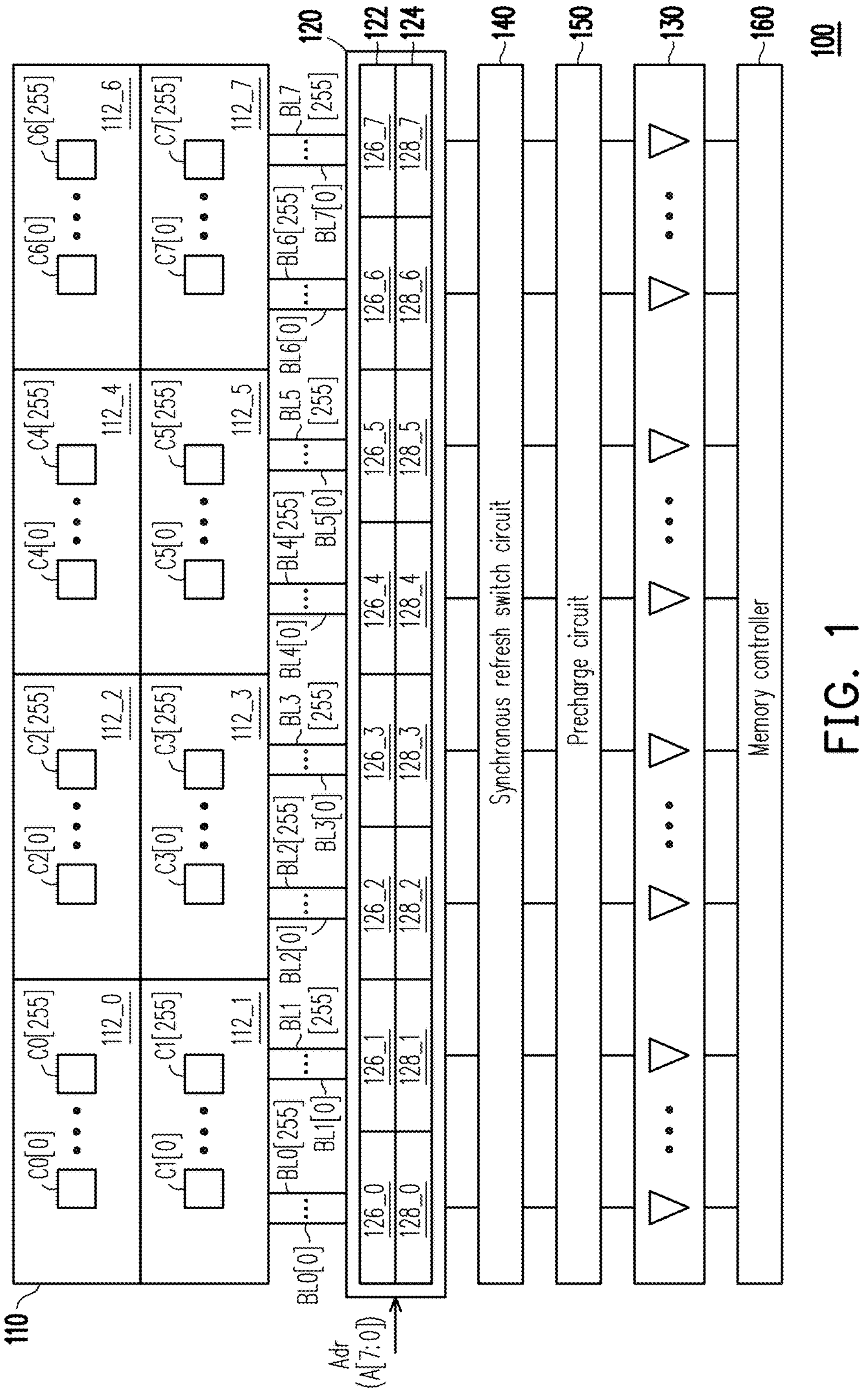
FIG. 1 shows a block diagram of a flash memory apparatus of an embodiment of the invention.

Referring to FIG. 1, a flash memory apparatus 100 includes a memory array 110, a decoder 120, a sensing circuit 130, a synchronous refresh switch circuit 140, a precharge circuit 150, and a memory controller 160. The memory array 110 is, for example, an ETOX NOR flash memory array. The memory array 110 includes a plurality of memory regions 112_0 to 112_7. Each of the memory regions 112_0 to 112_7 includes 256 memory cells respectively coupled to 256 bit lines. Specifically, memory cells C0[0] to C0[255] in the memory region 112_0 are respectively coupled to bit lines BL0[0] to BL0[255], and the memory cells C1[0] to C1[255] in the memory region 112_1 are respectively coupled to the bit lines BL1[0] to BL1[255], and so on. For the convenience of description, the bit lines BLK[0] to BLK[255] are collectively referred to as bit lines BLK, the memory cells CK[0] to CK[255] are collectively referred to as memory cells CK, and K is 0 to 7.

The decoder 120 is coupled to the bit lines BL0 to BL7. The decoder 120 may be configured to receive an address signal Adr, and select a plurality of target memory cells from the memory cells C0 to C7 according to the address signal Adr.

Figure 2:
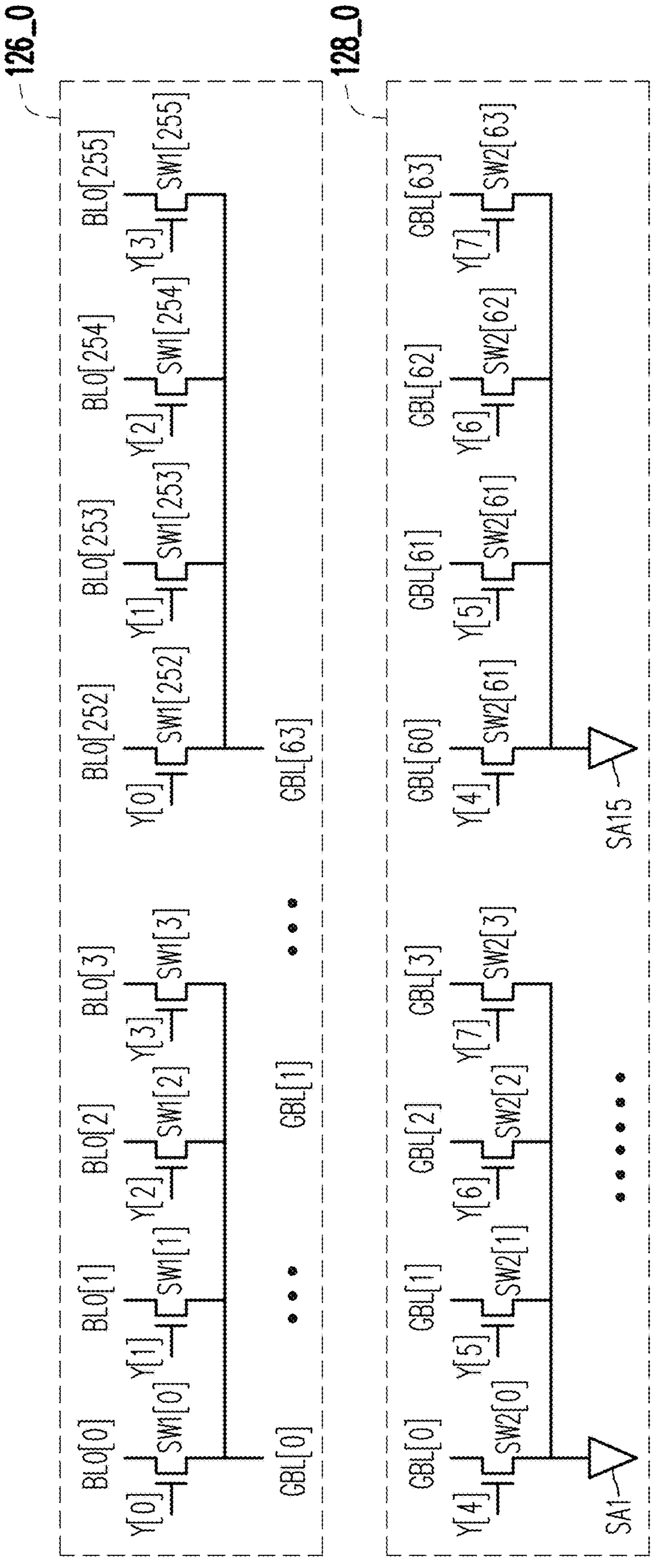
FIG. 2 shows a partial circuit schematic diagram of the decoder of the embodiment of FIG. 1.

The implementation details of the decoder 120 are described below with an embodiment. Referring to FIG. 1 and FIG. 2, the decoder 120 includes a first switch circuit 122 and a second switch circuit 124. The first switch circuit 122 includes first switch groups 126_0 to 126_7, and the second switch circuit 124 includes second switch groups 128_0 to 128_7. Each of the first switch groups 126_0 to 126_7 is coupled between the corresponding bit line and the corresponding global bit line. Each of the second switch groups 128_0 to 128_7 is coupled between the corresponding global bit line and the first input terminal of the corresponding sense amplifier (can correspond to a first sense amplifier 410 or a second sense amplifier 420 described later) in the sensing circuit 130. It should be noted that, for ease of understanding, the related circuits of the synchronous refresh switch circuit 140 and the precharge circuit 150 are omitted in FIG. 2.

The decoder 120 may decode the address signal Adr (can be decoded into the bit values A[7:0]) to provide first selection signals Y[0] to Y[3] to each of the first switch groups 126_0 to 126_7 and provide second selection signals Y[4] to Y[7] to each of the second switch groups 128_0 to 128_7 according to the bit values A[3:0] in the address signal Adr. The bit values A[1:0] may be decoded into the first selection signals Y[0] to Y[3], so that one of the first selection signals Y[0] to Y[3] is at a high logic level, and the other three are at a low logic level. The bit values A[3:2] may be decoded into the second selection signals Y[4] to Y[7], so that one of the second selection signals Y[4] to Y[7] is at a high logic level, and the other three are at a low logic level.

Taking the first switch group 126_0 and the second switch group 128_0 as an example, in FIG. 2, the first switch group 126_0 includes switches SW1[0] to SW1[255]. The switches SW1[0] to SW1[255] are respectively coupled between the bit lines BL0[0] to BL0[255] and the global bit lines GBL[0] to GBL[63]. Taking FIG. 2 as an example, the first terminals of the switches SW1[0] to SW1[3] are coupled to the bit lines BL0[0] to BL0[3] respectively, and the second terminals of the switches SW1[0] to SW1[3] are commonly coupled to the global bit line GBL[0]. The switches SW1[0] to SW1[3] of the first switch group 126_0 may select one of the bit lines BL0[0] to BL0[3] according to the first selection signals Y[0] to Y[3] to be coupled to the global bit line GBL[0].

Similarly, the first terminals of the switches SW1[252] to SW1[255] are coupled to the bit lines BL0[252] to BL0[255] respectively, and the second terminals of the switches SW1[252] to SW1[255] are commonly coupled to the global bit line GBL[63]. The switches SW1[252] to SW1[255] of the first switch group 126_0 may select one of the bit lines BL0[252] to BL0[255] according to the first selection signals Y[0] to Y[3] to be coupled to the global bit line GBL[63].

The second switch group 128_0 includes switches SW2[0] to SW2[63]. The switches SW2[0] to SW2[63] are respectively coupled between the global bit lines GBL[0] to GBL[63] and the first input terminals of sense amplifiers SA0 to SA15. Taking FIG. 2 as an example, the first terminals of the switches SW2[0] to SW2[3] are respectively coupled to the global bit lines GBL[0] to GBL[3], and the second terminals of the switches SW2[0] to SW2[3] are commonly coupled to the first input terminal of the sense amplifier SA0. The switches SW2[0] to SW2[3] of the second switch group 128_0 may select one of the global bit lines GBL[0] to GBL[3] according to the second selection signals Y[4] to Y[7] to be coupled to the first input terminal of the sense amplifier SA1.

Similarly, the first terminals of the switches SW2[60] to SW2[63] are respectively coupled to the global bit lines GBL[60] to GBL[63], and the second terminals of the switches SW2[60] to SW2[63] are commonly coupled to the first input terminal of the sense amplifier SA15. The switches SW2[60] to SW2[63] of the second switch group 128_0 may select one of the global bit lines GBL[60] to GBL[63] according to the second selection signals Y[4] to Y[7] to be coupled to the first input terminal of the sense amplifier SA15.

Figure 3:
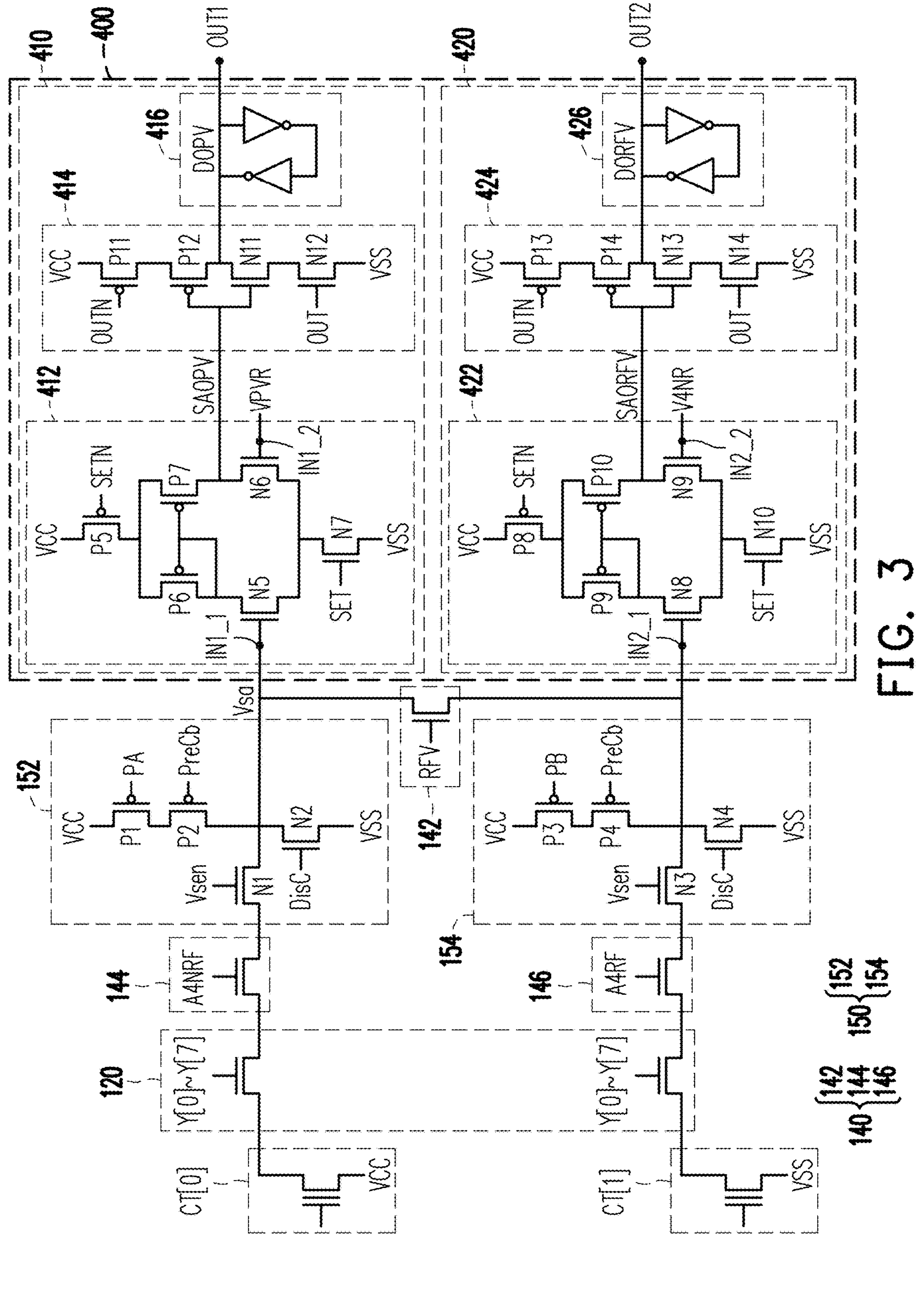
FIG. 3 shows a partial circuit schematic diagram of the flash memory apparatus of the embodiment of FIG. 1.

The following embodiments are used to describe the implementation details of the sensing circuit 130, the synchronous refresh switch circuit 140, and the precharge circuit 150. Refer to FIG. 1 and FIG. 3. The sensing circuit 130 includes a plurality of sense amplifier groups 400. Each of the sense amplifier groups 400 includes a first sense amplifier 410 and a second sense amplifier 420. A first input terminal IN1_1 of the first sense amplifier 410 and a first input terminal IN2_1 of the second sense amplifier 420 may be coupled to the decoder 120 via the synchronous refresh switch circuit 140 and the precharge circuit 150. An example of the detailed circuits between each of the sense amplifier groups 400 and the decoder 120 is shown in FIG. 3.

The synchronous refresh switch circuit 140 includes a plurality of first synchronous refresh switches 142, a plurality of second synchronous refresh switches 144, and a plurality of third synchronous refresh switches 146. As shown in FIG. 3, each of the first synchronous refresh switches 142 is coupled between the first input terminal IN1_1 of the corresponding first sense amplifier 410 and the first input terminal IN2_1 of the corresponding second sense amplifier 420. Each of the second synchronous refresh switches 144 is coupled between the decoder 120 and the first input terminal IN1_1 of the corresponding first sense amplifier 410. Each of the third synchronous refresh switches 146 is coupled between the decoder 120 and the first input terminal IN2_1 of the corresponding second sense amplifier 420.

The precharge circuit 150 includes a plurality of first precharge circuits 152 and a plurality of second precharge circuits 154. As shown in FIG. 3, each of the first precharge circuits 152 is coupled between the corresponding second synchronous refresh switch 144 and the first input terminal IN1_1 of the corresponding first sense amplifier 410. Each of the second precharge circuits 154 is coupled between the corresponding third synchronous refresh switch 146 and the first input terminal IN2_1 of the corresponding second sense amplifier 420. The first precharge circuit 152 and the second precharge circuit 154 may be configured to perform respective precharge according to a precharge signal PreCb.

In the present embodiment, CT[0] and CT[1] are, for example, two target memory cells selected by the decoder 120 according to the first selection signals Y[0] to Y[3] and the second selection signals Y[4] to Y[7] decoded by the address signal Adr. During the refresh operation, the first synchronous refresh switch 142 is turned on, and the on-off states of the second synchronous refresh switch 144 and the third synchronous refresh switch 146 are complementary, so as to simultaneously perform refresh verification and program verification on one of the target memory cells CT[0] and CT[1]. In short, when the first synchronous refresh switch 142 and the second synchronous refresh switch 144 are turned on and the third synchronous refresh switch 146 is turned off, refresh verification and program verification may be simultaneously performed on the target memory cell CT[0], and when the first synchronous refresh switch 142 and the third synchronous refresh switch 146 are turned on and the second synchronous refresh switch 144 is turned off, refresh verification and program verification may be simultaneously performed on the target memory cell CT[1]. As shown in FIG. 3, the first synchronous refresh switch 142 is controlled by a first switch signal RFV to be turned on or turned off. The second synchronous refresh switch 144 is controlled by a second switch signal A4NRF to be turned on or turned off. The third synchronous refresh switch 146 is controlled by a third switch signal A4RF to be turned on or turned off.

In addition, in FIG. 3, the second input terminal IN1_2 of the first sense amplifier 410 receives a program verification reference voltage VPVR. A second input terminal IN2_2 of the second sense amplifier 420 receives a switching reference voltage V4NR. The voltage value of the switching reference voltage V4NR is adjustable. During the execution of the refresh operation, the switching reference voltage V4NR is switched to be equal to a refresh verification reference voltage VRFVR.

Furthermore, during the refresh operation performed on the target memory cell CT[0], since the first synchronous refresh switch 142 and the second synchronous refresh switch 144 are turned on, the third synchronous refresh switch 146 is turned off, and the first input terminal IN1_1 of the first sense amplifier 410 and the first input terminal IN1_1 of the first sense amplifier 410 simultaneously receive a sensing voltage Vsa generated by the target memory cell CT[0]. The sensing voltage Vsa may reflect the threshold voltage of the target memory cell CT[0]. In this case, the first sense amplifier 410 may compare the sensing voltage Vsa with the program verification reference voltage VPVR, so as to perform the program verification of the target memory cell CT[0], and generate a first output value DOPV according to the comparison result. At the same time, the second sense amplifier 420 may compare the sensing voltage Vsa with the refresh verification reference voltage VRFVR, so as to perform the refresh verification of the target memory cell CT[0], and generate a second output value DORFV according to the comparison result.

The memory controller 160 is coupled to the sensing circuit 130. The memory controller 160 may be configured to simultaneously determine whether the target memory cell CT[0] passes refresh verification and program verification according to the first output value DOPV output by an output terminal OUT1 of the first sense amplifier 410 and the second output value DORFV output by an output terminal OUT2 of the second sense amplifier 420 of each of the sense amplifier groups 400. For example, when the first output value DOPV is at a low logic level (representing logic 0) and the second output value DORFV is at a low logic level (representing logic 0), the sensing voltage Vsa of the target memory cell CT[0] is higher than the program verification reference voltage VPVR and the refresh verification reference voltage VRFVR, and the target memory cell CT[0] passes the verification, and the refresh operation is completed. Moreover, when the first output value DOPV is at a high logic level (representing logic 1) and the second output value DORFV is at a low logic level (representing logic 0), the sensing voltage Vsa of the target memory cell CT[0] is between the program verification reference voltage VPVR and the refresh verification reference voltage VRFVR, and the target memory cell CT[0] fails the verification. Therefore, the memory controller 160 may then apply a refresh voltage to the target memory cell CT[0] to restore the sensing voltage Vsa of the target memory cell CT[0] to be higher than the program verification reference voltage VPVR.

In addition, during the program operation performed on the target memory cells CT[0] and CT[1], the first synchronous refresh switch 142 is turned off, and the second synchronous refresh switch 144 and the third synchronous refresh switch 146 are turned on. At this time, the switching reference voltage V4NR is switched to be equal to the program verification reference voltage VPVR, so that the sensing voltages generated by the target memory cells CT[0] and CT[1] may be compared with the program verification reference voltage VPVR via the first sense amplifier 410 and the second sense amplifier 420, respectively, so as to synchronize the program verification of the target memory cells CT[0] and CT[1].

The memory controller 160 not only may be, for example, a central processing unit (CPU), or other programmable general-purpose or special-purpose microprocessors, digital signal processors (DSP), programmable controllers, application-specific integrated circuits (ASIC), programmable logic devices (PLD), or other similar devices or a combination of these devices, but may also be hardware circuits designed via hardware description language (HDL) or any other digital circuit design method familiar to those having ordinary skill in the art and implemented via a method such as field-programmable gate array (FPGA) or a complex programmable logic device (CPLD).

It should be noted that the invention does not limit the quantity of memory regions and the quantity of memory cells in the memory array 110. Those skilled in the art may extrapolate the quantity thereof to less or more depending on actual needs thereof according to the teachings of the invention.

In terms of implementation details, in FIG. 3, the first precharge circuit 152 includes a first N-type field-effect transistor N1, a first P-type field-effect transistor P1, a second P-type field-effect transistor P2, and a second N-type field-effect transistor N2. The first terminal of the first N-type field-effect transistor N1 is coupled to the second synchronous refresh switch 144, and the control terminal thereof receives a sensing enable signal Vsen. The first terminal of the first P-type field-effect transistor P1 is coupled to a first power supply voltage VCC (for example, 3.3 volts or 5 volts), and the control terminal thereof receives a first precharge enable signal PA. The first terminal of the second P-type field-effect transistor P2 is coupled to the second terminal of the first P-type field-effect transistor P1, the second terminal thereof is coupled to the second terminal of the first N-type field-effect transistor N1 and the first input terminal IN1_1 of the first sense amplifier 410, and the control terminal thereof receives the precharge signal PreCb. The first terminal of the second N-type field-effect transistor N2 is coupled to the second terminal of the second P-type field-effect transistor P2, the second terminal thereof is coupled to the second power supply voltage VSS (for example, 0 volts), and the control terminal receives a pull-down signal DisC.

The second precharge circuit 154 includes a third N-type field-effect transistor N3, a third P-type field-effect transistor P3, a fourth P-type field-effect transistor P4, and a fourth N-type field-effect transistor N4. The first terminal of the third N-type field-effect transistor N3 is coupled to the third synchronous refresh switch 146, and the control terminal thereof receives the sensing enable signal Vsen. The first terminal of the third P-type field-effect transistor P3 is coupled to the first power supply voltage VCC, and the control terminal thereof receives a second precharge enable signal PB. The first terminal of the fourth P-type field-effect transistor P4 is coupled to the second terminal of the third P-type field-effect transistor P3, the second terminal thereof is coupled to the second terminal of the third N-type field-effect transistor N3 and the first input terminal IN2_1 of the second sense amplifier 420, and the control terminal thereof receives the precharge signal PreCb. The first terminal of the fourth N-type field-effect transistor N4 is coupled to the second terminal of the fourth P-type field-effect transistor P4, the second terminal thereof is coupled to the second power supply voltage VSS, and the control terminal thereof receives the pull-down signal DisC.

The first sense amplifier 410 includes a first differential circuit 412, a first inverter circuit 414, and a first latch 416. The first differential circuit 412 may compare the voltage (the sensing voltage Vsa of the target memory cell CT[0] or CT[1]) input from the first input terminal IN1_1 of the first sense amplifier 410 with the program verification reference voltage VPVR input from the second input terminal IN1_2 of the first sense amplifier 410 to generate a first comparison signal SAOPV. The first inverter circuit 414 is coupled to the first differential circuit 412. The first inverter circuit 414 may be configured to receive the first comparison signal SAOPV to provide the first output value DOPV to the output terminal OUT1 of the first sense amplifier 410. The first latch 416 is coupled to the output terminal OUT1 of the first sense amplifier 410 and may be configured to latch the first output value DOPV at the output terminal OUT1.

The second sense amplifier 420 includes a second differential circuit 422, a second inverter circuit 424, and a second latch 426. The second differential circuit 422 may compare the voltage (the sensing voltage Vsa of the target memory cell CT[0] or CT[1]) input from the first input terminal IN2_1 of the second sense amplifier 420 with the switching reference voltage V4NR input from the second input terminal IN2_2 of the second sense amplifier 420 to generate a second comparison signal SAORFV. The second inverter circuit 424 is coupled to the second differential circuit 422. The second inverter circuit 424 may be configured to receive the second comparison signal SAORFV to provide the second output value DORFV to the output terminal OUT2 of the second sense amplifier 420. The second latch 426 is coupled to the output terminal OUT2 of the second sense amplifier 420 and may be configured to latch the second output value DORFV at the output terminal OUT2.

In detail, as shown in FIG. 3, the first differential circuit 412 includes a fifth P-type field-effect transistor P5, a sixth P-type field-effect transistor P6, a seventh P-type field-effect transistor P7, the fifth N-type field-effect transistor N5, a sixth N-type field-effect transistor N6, and a seventh N-type field-effect transistor N7. The first terminal of the fifth P-type field-effect transistor P5 is coupled to the first power supply voltage VCC, and the control terminal thereof receives a negative setting signal SETN. The first terminal of the sixth P-type field-effect transistor P6 is coupled to the second terminal of the fifth P-type field-effect transistor P5, and the second terminal thereof and the control terminal thereof are coupled to each other. The first terminal of the seventh P-type field-effect transistor P7 is coupled to the second terminal of the fifth P-type field-effect transistor P5, the second terminal thereof is configured to generate the first comparison signal SAOPV, and the control terminal thereof is coupled to the control terminal of the sixth P-type field-effect transistor P6. The first terminal of the fifth N-type field-effect transistor N5 is coupled to the second terminal of the sixth P-type field-effect transistor P6, and the control terminal thereof is coupled to the first input terminal IN1_1 of the first sense amplifier 410. The first terminal of the sixth N-type field-effect transistor N6 is coupled to the second terminal of the seventh P-type field-effect transistor P7, and the control terminal thereof is coupled to the second input terminal IN1_2 of the first sense amplifier 410. The first terminal of the seventh N-type field-effect transistor N7 is coupled to the second terminal of the fifth N-type field-effect transistor N5 and the second terminal of the sixth N-type field-effect transistor N6, the second terminal thereof is coupled to the second power supply voltage VSS, and the control terminal thereof receives a positive setting signal SET.

The second differential circuit 422 includes an eighth P-type field-effect transistor P8, a ninth P-type field-effect transistor P9, a tenth P-type field-effect transistor P10, an eighth N-type field-effect transistor N8, a ninth N-type field-effect transistor N9, and a tenth N-type field-effect transistor N10. The first terminal of the eighth P-type field-effect transistor P8 is coupled to the first power supply voltage VCC, and the control terminal thereof receives the negative setting signal SETN. The first terminal of the ninth P-type field-effect transistor P9 is coupled to the second terminal of the eighth P-type field-effect transistor P8, and the second terminal thereof and the control terminal thereof are coupled to each other. The first terminal of the tenth P-type field-effect transistor P10 is coupled to the second terminal of the eighth P-type field-effect transistor P8, the second terminal thereof is configured to generate the second comparison signal SAORFV, and the control terminal thereof is coupled to the control terminal of the ninth P-type field-effect transistor P9. The first terminal of the eighth N-type field-effect transistor N8 is coupled to the second terminal of the ninth P-type field-effect transistor P9, and the control terminal thereof is coupled to the first input terminal IN2_1 of the second sense amplifier 420. The first terminal of the ninth N-type field-effect transistor N9 is coupled to the second terminal of the tenth P-type field-effect transistor P10, and the control terminal thereof is coupled to the second input terminal IN2_2 of the second sense amplifier 420. The first terminal of the tenth N-type field-effect transistor N10 is coupled to the second terminal of the eighth N-type field-effect transistor N8 and the second terminal of the ninth N-type field-effect transistor N9, the second terminal thereof is coupled to the second power supply voltage VSS, and the control terminal thereof receives the positive setting signal SET.

The first inverter circuit 414 includes an eleventh P-type field-effect transistor P11, a twelfth P-type field-effect transistor P12, an eleventh N-type field-effect transistor N11, and a twelfth N-type field-effect transistor N12. The first terminal of the eleventh P-type field-effect transistor P11 is coupled to the first power supply voltage VCC, and the control terminal thereof receives a negative output signal OUTN. The first terminal of the twelfth P-type field-effect transistor P12 is coupled to the second terminal of the eleventh P-type field-effect transistor P11, the second terminal thereof is coupled to the output terminal OUT1 of the first sense amplifier 410, and the control terminal thereof is coupled to the second terminal of the seventh P-type field-effect transistor P7. The first terminal of the eleventh N-type field-effect transistor N11 is coupled to the second terminal of the twelfth P-type field-effect transistor P12, and the control terminal thereof is coupled to the second terminal of the seventh P-type field-effect transistor P7. The first terminal of the twelfth N-type field-effect transistor N12 is coupled to the second terminal of the eleventh N-type field-effect transistor N11, the second terminal thereof is coupled to the second power supply voltage VSS, and the control terminal thereof receives a positive output signal OUT.

The second inverter circuit 424 includes a thirteenth P-type field-effect transistor P13, a fourteenth P-type field-effect transistor P14, a thirteenth N-type field-effect transistor N13, and a fourteenth N-type field-effect transistor N14. The first terminal of the thirteenth P-type field-effect transistor P13 is coupled to the first power supply voltage VCC, and the control terminal thereof receives the negative output signal OUTN. The first terminal of the fourteenth P-type field-effect transistor P14 is coupled to the second terminal of the thirteenth P-type field-effect transistor P13, the second terminal thereof is coupled to the output terminal OUT2 of the second sense amplifier 420, and the control terminal thereof is coupled to the second terminal of the tenth P-type field-effect transistor P10. The first terminal of the thirteenth N-type field-effect transistor N13 is coupled to the second terminal of the fourteenth P-type field-effect transistor P14, and the control terminal thereof is coupled to the second terminal of the tenth P-type field-effect transistor P10. The first terminal of the fourteenth N-type field-effect transistor N14 is coupled to the second terminal of the thirteenth N-type field-effect transistor N13, the second terminal thereof is coupled to the second power supply voltage VSS, and the control terminal thereof receives the positive output signal OUT.

In addition, the memory controller 160 may provide the first switch signal RFV to the first synchronous refresh switch 142 to turn on or turn off the first synchronous refresh switch 142. The second switch signal A4NRF, the third switch signal A4RF, the first precharge enable signal PA, and the second precharge enable signal PB may be generated according to the first switch signal RFV and the address signal Adr. For example, referring to FIG. 4, the flash memory apparatus 100 further includes a control circuit 500. The control circuit 500 receives the first switch signal RFV and the positive bit signal SA[4] and the negative bit signal SA[4] N generated based on the bit value A[4] in the address signal Adr to generate the second switch signal A4NRF, the third switch signal A4RF, the first precharge enable signal PA, and the second precharge enable signal PB accordingly. In particular, the logic state of the positive bit signal SA[4] may correspond to the logic value of the bit value A[4], and the logic states of the positive bit signal SA[4] and the negative bit signal SA[4] N are complementary.

Figure 4:
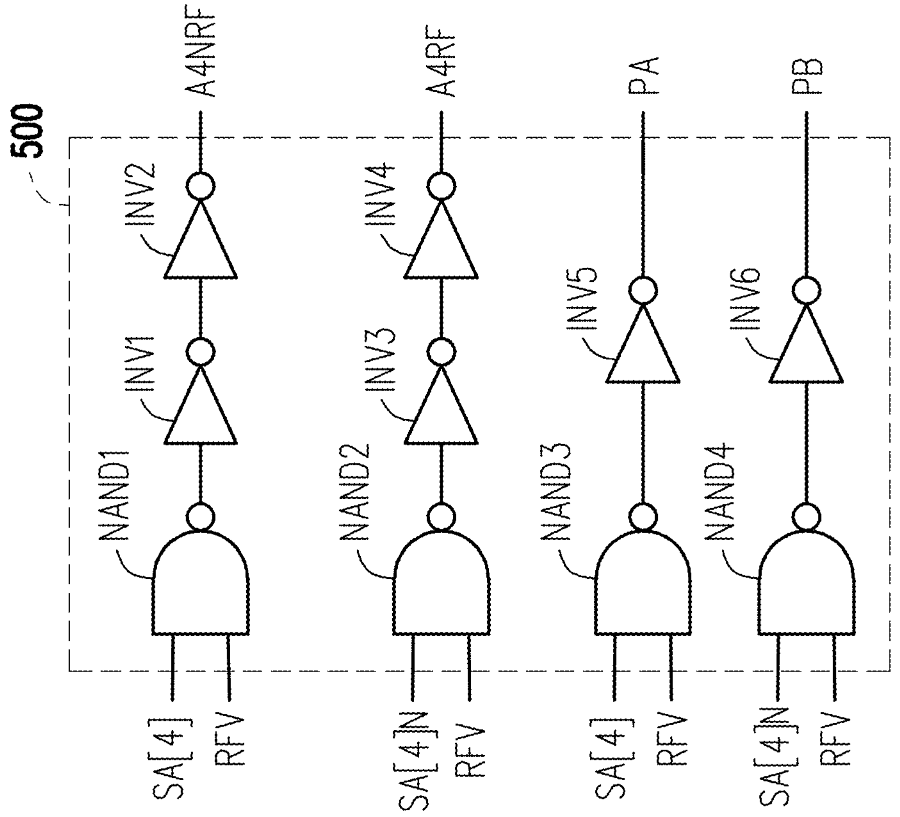
FIG. 4 shows a schematic circuit diagram of a control circuit of an embodiment of the invention.

In detail, as shown in FIG. 4, the control circuit 500 includes a first NAND gate NAND1, a second NAND gate NAND2, a third NAND gate NAND3, a fourth NAND gate NAND4, and first to sixth inverters INV1 to INV6. The first input terminal of the first NAND gate NAND1 receives the positive bit signal SA[4], and the second input terminal receives the first switch signal RFV. The input terminal of the first inverter INV1 is coupled to the output terminal of the first NAND gate NAND1. The input terminal of the second inverter INV2 is coupled to the output terminal of the first inverter INV1, and the output terminal thereof outputs the second switch signal A4NRF. The first input terminal of the second NAND gate NAND2 receives the negative bit signal SA[4], and the second input terminal thereof receives the first switch signal RFV. The input terminal of the third inverter INV3 is coupled to the output terminal of the second NAND gate NAND2. The input terminal of the fourth inverter INV4 is coupled to the output terminal of the third inverter INV3, and the output terminal thereof outputs the third switch signal A4RF. The first input terminal of the third NAND gate NAND3 receives the positive bit signal SA[4], and the second input terminal thereof receives the first switch signal RFV. The input terminal of the fifth inverter INV5 is coupled to the output terminal of the third inverter NAND3, and the output terminal thereof outputs the first precharge enable signal PA. The first input terminal of the fourth NAND gate NAND4 receives the negative bit signal SA[4], and the second input terminal thereof receives the first switch signal RFV. The input terminal of the sixth inverter INV6 is coupled to the output terminal of the fourth inverter NAND4, and the output terminal thereof outputs the second precharge enable signal PB.

Based on the configuration of the control circuit 500, when the first switch signal RFV is at a low logic level, regardless of the logic level of the positive bit signal SA[4] and the negative bit signal SA[4] N, the second switch signal A4NRF and the third switch signal A4RF are at a high logic level. At this time, the first synchronous refresh switch 142 is turned off, the second synchronous refresh switch 144 and the third synchronous refresh switch 146 are turned on, and the target memory cells CT[0] and CT[1] are coupled to the first sense amplifier 410 and the second sense amplifier 420 respectively. In addition, the first precharge enable signal PA and the second precharge enable signal PB also remain at a low logic level to enable simultaneously precharging the first precharge circuit 152 and the second precharge circuit 154.

When the first switch signal RFV and the negative bit signal SA[4] N are at a high logic level, and the positive bit signal SA[4] is at a low logic level, the second switch signal A4NRF is at a high logic level, and the third switch signal A4RF is at a low logic level. At this time, the first synchronous refresh switch 142 and the second synchronous refresh switch 144 are turned on, the third synchronous refresh switch 146 is turned off, and the target memory cell CT[0] is simultaneously coupled to the first sense amplifier 410 and the second sense amplifier 420. In addition, the first precharge enable signal PA remains at a low logic level, and the second precharge enable signal PB remains at a high logic level to individually enable precharging the first precharge circuit 152.

When the first switch signal RFV and the positive bit signal SA[4] are at a high logic level, and the negative bit signal SA[4] N is at a low logic level, the second switch signal A4NRF is at a low logic level, and the third switch signal A4RF is at a high logic level. At this time, the first synchronous refresh switch 142 and the third synchronous refresh switch 146 are turned on, the second synchronous refresh switch 144 is turned off, and the target memory cell CT[1] is simultaneously coupled to the first sense amplifier 410 and the second sense amplifier 420. In addition, the first precharge enable signal PA remains at a high logic level, and the second precharge enable signal PB remains at a low logic level to individually enable precharging the second precharge circuit 154.

In addition, the precharge signal PreCb, the pull-down signal DisC, the positive setting signal SET, the negative setting signal SETN, the positive output signal OUT, and the negative output signal OUTN may be provided by the memory controller 160, for example. In particular, the logic states of the positive setting signal SET and the negative setting signal SETN are complementary, and the logic states of the positive output signal OUT and the negative output signal OUTN are complementary.

Figure 5:
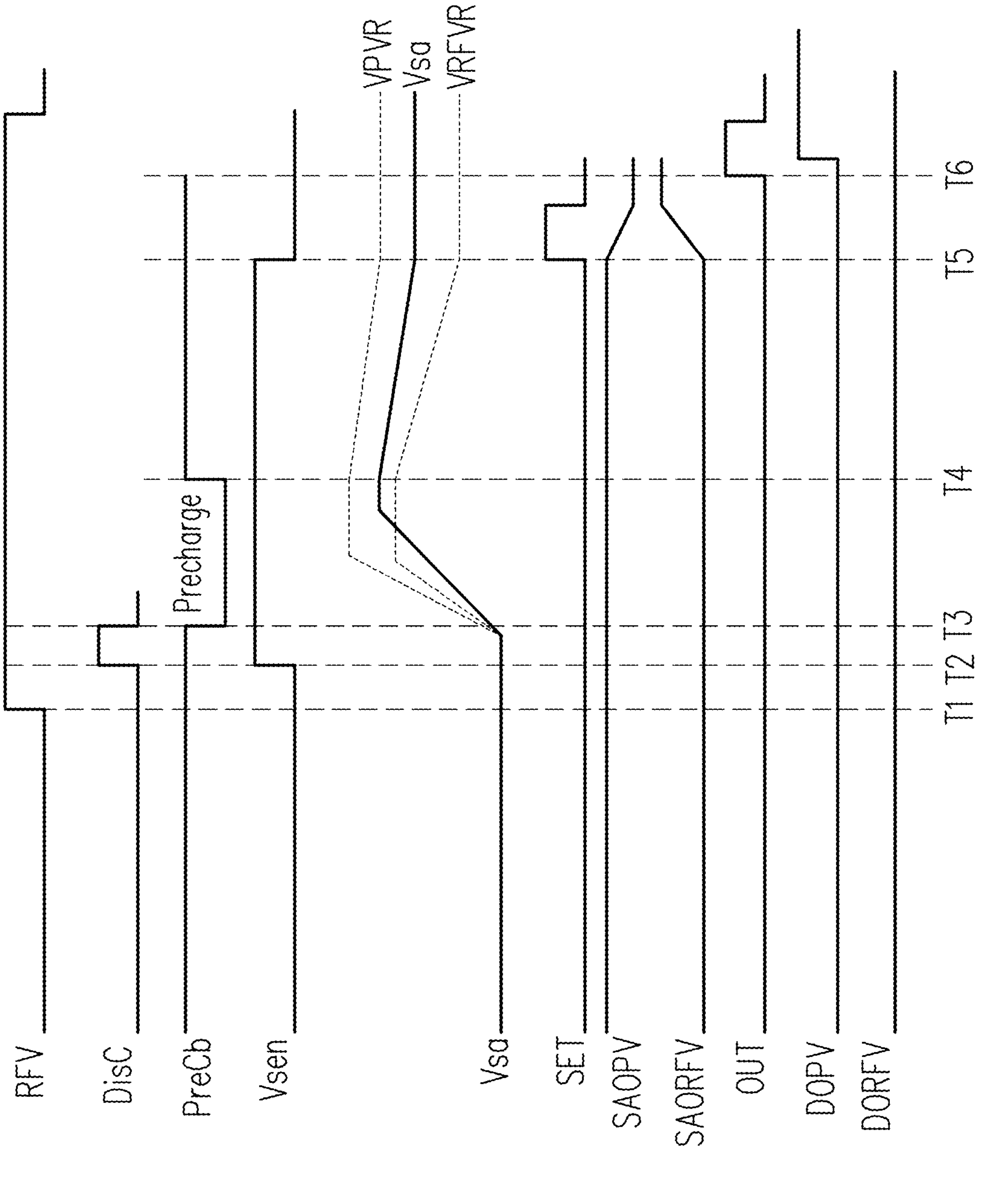
FIG. 5 shows a schematic waveform diagram of a refresh operation of an embodiment of the invention.

The following describes the refresh operation of the target memory cell CT[0] with reference to FIG. 5. Referring to FIG. 3 and FIG. 5, when the refresh operation of the target memory cell CT[0] is to be started (i.e., a time point T1), the first switch signal RFV transmitted to the first synchronous refresh switch 142 is changed from a low logic level to a high logic level to turn on the first synchronous refresh switch 142. At the same time, the bit value A[4] in the address signal Adr is logic 0, the generated positive bit signal SA[4] is at a low logic level, and the negative bit signal SA[4] N is at a high logic level. Therefore, the second synchronous refresh switch 144 may be turned on, the third synchronous refresh switch 146 may be turned off, and the precharging of the first precharge circuit 152 may be enabled via the action of the control circuit 500.

Then, at a time point T2, the pull-down signal DisC transmitted to the second N-type field-effect transistor N2 is changed from a low logic level to a high logic level to turn on the second N-type field-effect transistor N2, so that the first input terminal IN1_1 of the first sense amplifier 410 is first discharged. At the same time, the sensing enable signal Vsen transmitted to the first N-type field-effect transistor N1 is also changed from a low logic level to a high logic level. In this way, the target memory cell CT[0] is simultaneously coupled to the first input terminal IN1_1 of the first sense amplifier 410 and the first input terminal IN2_1 of the second sense amplifier 420.

Then, during the period from time points T3 to T4, the precharge signal PreCb transmitted to the second P-type field-effect transistor P2 is changed from a high logic level to a low logic level to perform the precharging of the first precharge circuit 152.

At the time point T4, the precharging ends. During the period from time points T4 to T5, the sensing voltage Vsa generated by the target memory cell CT[0] gradually reaches a stable value. FIG. 5 shows the situation in which the sensing voltage Vsa of the target memory cell CT[0] is between the program verification reference voltage VPVR and the refresh verification reference voltage VRFVR.

At the time point T5, the positive setting signal SET transmitted to the seventh N-type field-effect transistor N7 and the tenth N-type field-effect transistor N10 is changed from a low logic level to a high logic level, and the negative setting signal SETN transmitted to the fifth P-type field-effect transistor P5 and the eighth P-type field-effect transistor P8 is changed from a high logic level to a low logic level, so that the first differential circuit 412 and the second differential circuit 422 generate the first comparison signal SAOPV and the second comparison signal SAORFV respectively.

Lastly, at a time point T6, the positive output signal OUT transmitted to the twelfth N-type field-effect transistor N12 and the fourteenth N-type field-effect transistor N14 is changed from a low logic level to a high logic level, and the negative output signal OUTN transmitted to the eleventh P-type field-effect transistor P11 and the thirteenth P-type field-effect transistor P13 is changed from a high logic level to a low logic level, so that the first inverter circuit 414 and the second inverter circuit 424 provide the first output value DOPV and the second output value DORFV to the output terminal OUT1 and the output terminal OUT2 respectively that are then output to the memory controller 160.

Based on the above, the flash memory apparatus of the invention may simultaneously transmit the sensing voltage generated from the selected target memory cells to two different sense amplifiers during the refresh operation. In this way, the refresh verification and the program verification may be simultaneously performed on the target memory cells, thereby reducing verification time and thereby improving the execution efficiency of the erase operation.

What is claimed is:

1. A flash memory apparatus, comprising:

a memory array comprising a plurality of memory regions, wherein each of the memory regions comprises a plurality of memory cells;

a plurality of bit lines respectively coupled to the memory cells;

a decoder coupled to the bit lines and configured to receive an address signal and select a plurality of target memory cells from the plurality of memory cells according to the address signal;

a sensing circuit comprising a plurality of sense amplifier groups, wherein each of the sense amplifier groups comprises a first sense amplifier and a second sense amplifier, and a first input terminal of the first sense amplifier and a first input terminal of the second sense amplifier are coupled to the decoder; and a synchronous refresh switch circuit comprising a plurality of first synchronous refresh switches, wherein the first synchronous refresh switches are respectively coupled between the first input terminal of the first sense amplifier and the first input terminal of the second sense amplifier of each of the sense amplifier groups, wherein during a refresh operation, the first synchronous refresh switches are turned on to simultaneously perform a refresh verification and a program verification on the corresponding target memory cells.

2. The flash memory apparatus of claim 1, further comprising:

a memory controller coupled to the sensing circuit and configured to simultaneously determine whether the corresponding target memory cells pass the refresh verification and the program verification according to a first output value output by the first sense amplifier and a second output value output by the second sense amplifier of each of the sense amplifier groups.

3. The flash memory apparatus of claim 2, wherein the memory controller respectively provides a plurality of first switch signals to the first synchronous refresh switches to turn on or turn off the first synchronous refresh switches.

4. The flash memory apparatus of claim 1, wherein a second input terminal of the first sense amplifier of each of the sense amplifier groups receives a program verification reference voltage, a second input terminal of the second sense amplifier of each of the sense amplifier groups receives a switching reference voltage, and during the refresh operation, the switching reference voltage is switched to be equal to a refresh verification reference voltage.

5. The flash memory apparatus of claim 4, wherein during a program operation, the switching reference voltage is switched to be equal to the program verification reference voltage.

6. The flash memory apparatus of claim 1, wherein the decoder comprises a plurality of global bit lines, a first switch circuit, and a second switch circuit, the first switch circuit comprises a plurality of first switch groups, the second switch circuit comprises a plurality of second switch groups, each of the first switch groups is coupled between the corresponding bit lines and the corresponding global bit line, and each of the second switch groups is coupled between the corresponding global bit lines and the first input terminal of the corresponding first sense amplifier or second sense amplifier.

7. The flash memory apparatus of claim 6, wherein the decoder decodes the address signal to provide a plurality of first selection signals to each of the first switch groups and to provide a plurality of second selection signals to each of the second switch groups according to a plurality of bit values in the address signal, each of the first switch groups selects one of the corresponding bit lines according to the first selection signals to be coupled to the corresponding global bit line, and each of the second switch groups selects one of the corresponding global bit lines according to the second selection signals to be coupled to the first input terminal of the corresponding first sense amplifier or second sense amplifier.

8. The flash memory apparatus of claim 1, wherein the synchronous refresh switch circuit further comprises:

a plurality of second synchronous refresh switches respectively coupled between the decoder and the first input terminal of the first sense amplifier of each of the sense amplifier groups;

a plurality of third synchronous refresh switches respectively coupled between the decoder and a first input terminal of the second sense amplifier of each of the sense amplifier groups, wherein during the refresh operation, on-off states of the second synchronous refresh switches and the third synchronous refresh switches are complementary.

9. The flash memory apparatus of claim 8, further comprising a precharge circuit, the precharge circuit comprising:

a plurality of first precharge circuits respectively coupled between the second synchronous refresh switches and the first input terminal of the first sense amplifier of the sense amplifier groups and configured to precharge according to a precharge signal; and a plurality of second precharge circuits respectively coupled between the third synchronous refresh switches and the first input terminal of the second sense amplifier of the sense amplifier groups and configured to precharge according to the precharge signal.

10. The flash memory apparatus of claim 9, wherein each of the first precharge circuits comprises:

a first N-type field-effect transistor, wherein a first terminal thereof is coupled to the corresponding second synchronous refresh switch, and a control terminal thereof receives a sensing enable signal;

a first P-type field-effect transistor, wherein a first terminal thereof is coupled to a first power supply voltage, and a control terminal thereof receives a first precharge enable signal;

a second P-type field-effect transistor, wherein a first terminal thereof is coupled to a second terminal of the first P-type field-effect transistor, a second terminal thereof is coupled to a second terminal of the first N-type field-effect transistor and the first input terminal of the first sense amplifier of the corresponding sense amplifier group, and a control terminal thereof receives the precharge signal; and a second N-type field-effect transistor, wherein a first terminal thereof is coupled to the second terminal of the second P-type field-effect transistor, a second terminal thereof is coupled to a second power supply voltage, and a control terminal thereof receives a pull-down signal, wherein each of the second precharge circuits comprises:

a third N-type field-effect transistor, wherein a first terminal thereof is coupled to the corresponding third synchronous refresh switch, and a control terminal thereof receives the sensing enable signal;

a third P-type field-effect transistor, wherein a first terminal thereof is coupled to the first power supply voltage, and a control terminal thereof receives a second precharge enable signal;

a fourth P-type field-effect transistor, wherein a first terminal thereof is coupled to a second terminal of the third P-type field-effect transistor, a second terminal thereof is coupled to a second terminal of the third N-type field-effect transistor and the first input terminal of the second sense amplifier of the corresponding sense amplifier group, and a control terminal thereof receives the precharge signal; and a fourth N-type field-effect transistor, wherein a first terminal thereof is coupled to the second terminal of the fourth P-type field-effect transistor, a second terminal thereof is coupled to the second power supply voltage, and a control terminal thereof receives the pull-down signal.

11. The flash memory apparatus of claim 10, wherein each of the first synchronous refresh switches is controlled by a first switch signal to be turned on or turned off, each of the second synchronous refresh switches is controlled by a second switch signal to be turned on or turned off, and each of the third synchronous refresh switches is controlled by a third switch signal to be turned on or turned off, wherein the flash memory apparatus further comprises:

a control circuit receiving the first switch signal and a positive bit signal and a negative bit signal generated based on a bit value in the address signal, so as to generate the second switch signal, the third switch signal, the first precharge enable signal, and the second precharge enable signal, wherein logic states of the positive bit signal and the negative bit signal are complementary.

12. The flash memory apparatus of claim 11, wherein the control circuit comprises:

a first NAND gate, wherein a first input terminal thereof receives the positive bit signal, and a second input terminal thereof receives the first switch signal;

a first inverter, wherein an input terminal thereof is coupled to an output terminal of the first NAND gate;

a second inverter, wherein an input terminal thereof is coupled to an output terminal of the first inverter, and an output terminal thereof outputs the second switch signal;

a second NAND gate, wherein a first input terminal thereof receives the negative bit signal, and a second input terminal thereof receives the first switch signal;

a third inverter, wherein an input terminal thereof is coupled to an output terminal of the second NAND gate;

a fourth inverter, wherein an input terminal thereof is coupled to an output terminal of the third inverter, and an output terminal thereof outputs the third switch signal;

a third NAND gate, wherein a first input terminal thereof receives the positive bit signal, and a second input terminal thereof receives the first switch signal;

a fifth inverter, wherein an input terminal thereof is coupled to an output terminal of the third NAND gate, and an output terminal thereof outputs the first precharge enable signal;

a fourth NAND gate, wherein a first input terminal thereof receives the negative bit signal, and a second input terminal thereof receives the first switch signal; and a sixth inverter, wherein an input terminal thereof is coupled to an output terminal of the fourth NAND gate, and an output terminal thereof outputs the second precharge enable signal.

13. The flash memory apparatus of claim 1, wherein the first sense amplifier of each of the sense amplifier groups comprises:

a first differential circuit comparing a voltage input from the first input terminal of the first sense amplifier with a program verification reference voltage input from a second input terminal of the first sense amplifier to generate a first comparison signal; and a first inverter circuit coupled to the first differential circuit and configured to receive the first comparison signal to provide a first output value to an output terminal of the first sense amplifier, wherein the second sense amplifier of each of the sense amplifier groups comprises:

a second differential circuit comparing a voltage input from the first input terminal of the second sense amplifier with a switching reference voltage input from a second input terminal of the second sense amplifier to generate a second comparison signal; and a second inverter circuit coupled to the second differential circuit and configured to receive the second comparison signal to provide a second output value to an output terminal of the second sense amplifier.

14. The flash memory apparatus of claim 13, wherein the first differential circuit comprises:

a fifth P-type field-effect transistor, wherein a first terminal thereof is coupled to a first power supply voltage, and a control terminal thereof receives a negative setting signal;

a sixth P-type field-effect transistor, wherein a first terminal thereof is coupled to a second terminal of the fifth P-type field-effect transistor, and a second terminal thereof and a control terminal thereof are coupled to each other;

a seventh P-type field-effect transistor, wherein a first terminal thereof is coupled to the second terminal of the fifth P-type field-effect transistor, a second terminal thereof is configured to generate the first comparison signal, and a control terminal thereof is coupled to a control terminal of the sixth P-type field-effect transistor;

a fifth N-type field-effect transistor, wherein a first terminal thereof is coupled to the second terminal of the sixth P-type field-effect transistor, and a control terminal thereof is coupled to the first input terminal of the first sense amplifier;

a sixth N-type field-effect transistor, wherein a first terminal thereof is coupled to the second terminal of the seventh P-type field-effect transistor, and a control terminal thereof is coupled to the second input terminal of the first sense amplifier; and a seventh N-type field-effect transistor, wherein a first terminal thereof is coupled to a second terminal of the fifth N-type field-effect transistor and a second terminal of the sixth N-type field-effect transistor, a second terminal thereof is coupled to a second power supply voltage, and a control terminal thereof receives a positive setting signal;

wherein the second differential circuit comprises:

an eighth P-type field-effect transistor, wherein a first terminal thereof is coupled to the first power supply voltage, and a control terminal thereof receives the negative setting signal;

a ninth P-type field-effect transistor, wherein a first terminal thereof is coupled to a second terminal of the eighth P-type field-effect transistor, and a second terminal thereof and a control terminal thereof are coupled to each other;

a tenth P-type field-effect transistor, wherein a first terminal thereof is coupled to the second terminal of the eighth P-type field-effect transistor, a second terminal thereof is configured to generate the second comparison signal, and a control terminal thereof is coupled to a control terminal of the ninth P-type field-effect transistor;

an eighth N-type field-effect transistor, wherein a first terminal thereof is coupled to the second terminal of the ninth P-type field-effect transistor, and a control terminal thereof is coupled to the first input terminal of the second sense amplifier;

a ninth N-type field-effect transistor, wherein a first terminal thereof is coupled to the second terminal of the tenth P-type field-effect transistor, and a control terminal thereof is coupled to the second input terminal of the second sense amplifier; and a tenth N-type field-effect transistor, wherein a first terminal thereof is coupled to a second terminal of the eighth N-type field-effect transistor and a second terminal of the ninth N-type field-effect transistor, a second terminal thereof is coupled to the second power supply voltage, and a control terminal thereof receives the positive setting signal.

15. The flash memory apparatus of claim 14, wherein the first inverter circuit comprises:

an eleventh P-type field-effect transistor, wherein a first terminal thereof is coupled to the first power supply voltage, and a control terminal thereof receives a negative output signal;

a twelfth P-type field-effect transistor, wherein a first terminal thereof is coupled to a second terminal of the eleventh P-type field-effect transistor, a second terminal thereof is coupled to the output terminal of the first sense amplifier, and a control terminal thereof is coupled to the second terminal of the seventh P-type field-effect transistor;

an eleventh N-type field-effect transistor, wherein a first terminal thereof is coupled to the second terminal of the twelfth P-type field-effect transistor, and a control terminal thereof is coupled to the second terminal of the seventh P-type field-effect transistor; and a twelfth N-type field-effect transistor, wherein a first terminal thereof is coupled to a second terminal of the eleventh N-type field-effect transistor, a second terminal thereof is coupled to the second power supply voltage, and a control terminal thereof receives a positive output signal, wherein the second inverter circuit comprises:

a thirteenth P-type field-effect transistor, wherein a first terminal thereof is coupled to the first power supply voltage, and a control terminal thereof receives the negative output signal;

a fourteenth P-type field-effect transistor, wherein a first terminal thereof is coupled to a second terminal of the thirteenth P-type field-effect transistor, a second terminal thereof is coupled to the output terminal of the second sense amplifier, and a control terminal thereof is coupled to the second terminal of the tenth P-type field-effect transistor;

a thirteenth N-type field-effect transistor, wherein a first terminal thereof is coupled to the second terminal of the fourteenth P-type field-effect transistor, and a control terminal thereof is coupled to the second terminal of the tenth P-type field-effect transistor; and a fourteenth N-type field-effect transistor, wherein a first terminal thereof is coupled to a second terminal of the thirteenth N-type field-effect transistor, a second terminal thereof is coupled to the second power supply voltage, and a control terminal thereof receives the positive output signal.

16. The flash memory apparatus of claim 13, wherein the first sense amplifier of each of the sense amplifier groups further comprises:

a first latch coupled to the output terminal of the first sense amplifier, wherein the second sense amplifier of each of the sense amplifier groups further comprises:

a second latch coupled to the output terminal of the second sense amplifier.

* * * * *